United States Patent [19]

Takano et al.

[11] Patent Number: 5,725,385
[45] Date of Patent: Mar. 10, 1998

[54] PC CARD CONNECTOR

[75] Inventors: Yasunari Takano; Hidehiro Nakamura; Shin Yoshida, all of Miyagi-ken, Japan

[73] Assignee: Alps Electric Co., Ltd., Tokyo, Japan

[21] Appl. No.: 607,479

[22] Filed: Feb. 27, 1996

[30] Foreign Application Priority Data

Mar. 8, 1995 [JP] Japan .................... 7-048813

[51] Int. Cl.$^6$ .................... H01R 9/09
[52] U.S. Cl. .................... 439/64; 439/541.5; 439/79
[58] Field of Search .................... 439/79, 80, 64, 439/541.5

[56] References Cited

U.S. PATENT DOCUMENTS

| 5,318,452 | 6/1994 | Brennian | 439/79 |
| 5,354,207 | 10/1994 | Chikano | 439/79 |
| 5,364,275 | 11/1994 | Ota et al. | 439/79 |

Primary Examiner—Neil Abrams
Assistant Examiner—T. C. Patel
Attorney, Agent, or Firm—Guy W. Shoup

[57] ABSTRACT

A PC card connector in which a plurality of pin contacts are secured in a pin housing in a predetermined arrangement such that each of the plurality of pin contacts has a long and narrow terminal end protruding out from the pin housing. The front end portion of each terminal end is soldered onto a mounting surface of a printed board. The PC card connector includes first and second pin holders secured to the pin housing such that bottom surfaces of the pin holders are positioned opposite the mounting surface of the printed board, each of the first and second pin holders having a number of parallel guide grooves for receiving the terminal ends of the plurality of pin contacts. The bottom surfaces of the first and second pin holders are in resilient contact with the front end portions of the terminal ends, and the first and second pin holders are secured to the pin housing such that they are disposed, respectively, at the front and at the back of the pin housing, respectively, along the direction of insertion and removal of a PC card.

4 Claims, 11 Drawing Sheets

PC CARD CONNECTOR

BACKGROUND OF THE INVENTION

1. Field of the Invention

The present invention broadly relates to a PC card connector of a device used by inserting a PC card into a connector, and more particularly to a surface mounting type PC card connector in which the front end portion of the terminal end of each pin contact is soldered onto a printed board.

2. Description of the Related Art

The PC card (memory card) used, for example, in a notebook personal computer is a card inserted into and removed from a PC card connector designed specifically for this purpose. In recent years, the standardization of the shapes of PC cards, the dimensions and arrangements of pin contacts of PC card connectors, and the like have caused a sudden increase in the demand for PC card connectors capable of being used more widely for various purposes.

In general, the PC card connector comprises a header section having a number of pin contacts secured in a predetermined arrangement in a pin housing by press-fitting, frames to guide the PC cards being inserted or removed, and an eject mechanism fixed to each frame for ejecting the PC card. One end of each pin contact is formed into a substantially circular cylindrical contact end so that the pin contact can be inserted into and removed from the socket contact in the PC card. An anchor portion is formed at the back of a contact end, which is anchored in the inner wall face of a pin inserting hole of the pin housing. When each pin contact is press-fitted into and secured in the pin housing by anchoring of the anchor portion in the inner wall face of the pin inserting hole, the previously formed long and narrow terminal ends of the pin contacts project out downwardly from the back side of the pin housing. The front end portions of the terminal ends are aligned on a solder land and subjected to reflow soldering, thereby mounting the PC card connector onto the printed board.

In the above-described surface mounting type PC card connector, each of the large number of pin contact terminal end, when being formed, are bent such that the required degree of parallelism between the contact terminal ends protruding out from the pin housing and the required degree of flatness of the front end portions (soldering portions) of the terminal ends on the solder land of the printed board are preserved. The problem of faulty soldering was conventionally overcome by using a mounting jig, when mounting the connector onto the printed board, in order to align the terminal ends on the solder land, because the thin terminal ends with a thickness of about 0.3 millimeters were easy to deform and the arrangement pitch was narrow at 1.27 millimeters. However, relatively long terminal ends due to their springiness may become misaligned on the solder land after removal of the mounting jig. When this happens, the required degree of flatness of the front end portions of the terminal ends is lost, thus leading to faulty soldering.

SUMMARY OF THE INVENTION

Accordingly, an object of the present invention is to provide a PC card connector wherein the front end portions of the terminal ends of the pin contacts are aligned on the solder land with high precision in order to allow easy and reliable soldering of the terminal ends onto the printed board at predetermined positions.

The above-described object is achieved by a surface mounting type PC card connector wherein a plurality of pin contacts secured in a pin housing in a predetermined arrangement each have their long and narrow terminal ends protruding out from the pin housing and the front end portions of the terminal ends are soldered onto the printed board, wherein: pin holders are secured to the pin housing in order to place the bottom surfaces of the pin holders opposite the mounting surface of the printed board at a very close distance, the pin holders having a plurality of guide grooves in which the terminal ends of the plurality of pin contacts are positioned and the bottom surfaces of the pin holders being in resilient contact with the front end portions of the terminal ends.

The pin holders can be used to position the plurality of pin contact terminal ends protruding out from the pin housing by inserting the terminal ends into the guide grooves. Therefore, securing the pin holders to the pin housing allows the required degree of parallelism of the terminal ends to be preserved. In addition, with the front end portions (soldering sections) of the terminal ends previously formed facing upward with respect to the printed board, resiliently contacting the front end portion of each terminal end to the bottom surface of either of the pin holders being secured to the pin housing allows the required degree of parallelism of the front end portions of the terminal ends to be preserved. Thus, making the bottom surfaces of the pin holders oppose the mounting surface makes it possible to prevent displacement of the front end portions of the terminal ends.

DESCRIPTION OF A PREFERRED EMBODIMENT

A description will now be hereunder given of a preferred embodiment of the present invention.

Figure 1:
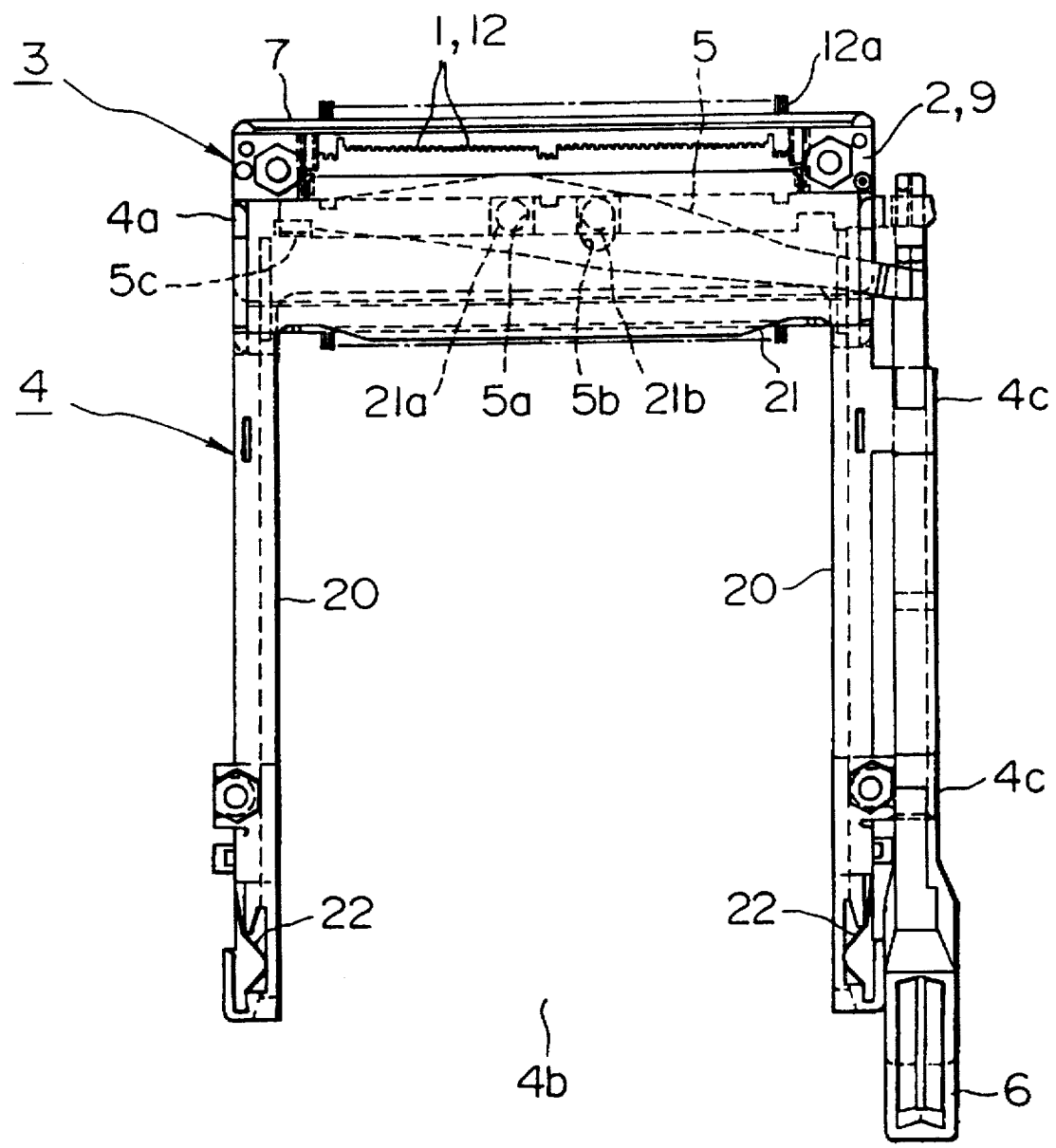
FIG. 1 is a plan view of the entire surface mounting type PC card connector of an embodiment of the present invention.
Figure 2:
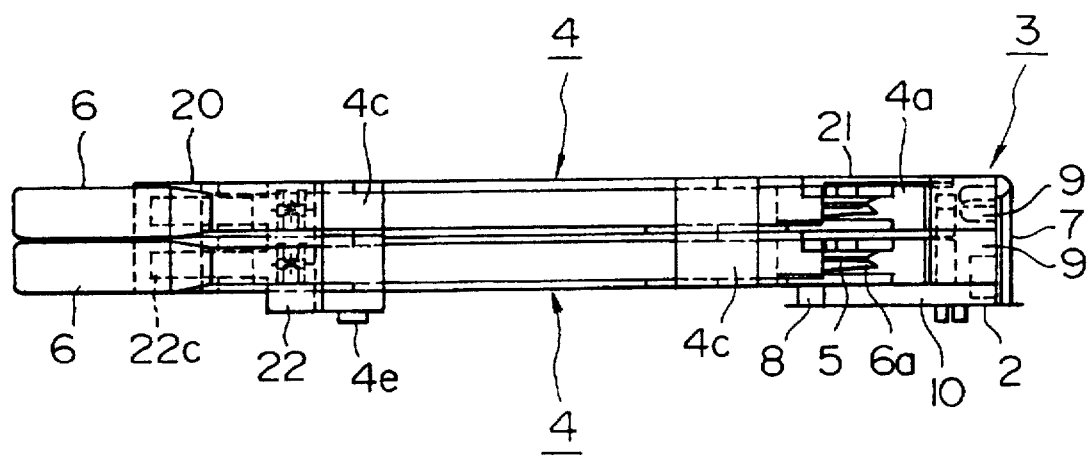
FIG. 2 is a side view of the entire PC card connector mentioned above.
Figure 3:
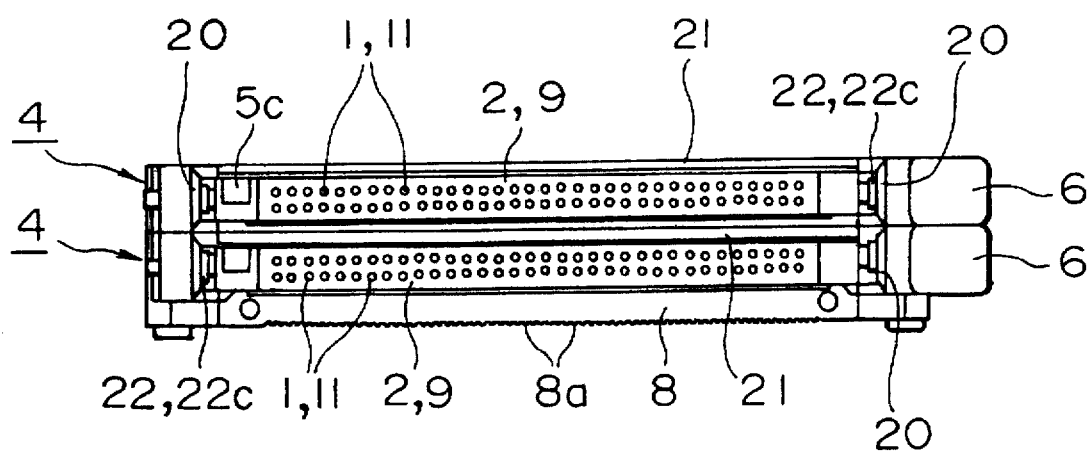
FIG. 3 is a front view of the entire PC card connector mentioned above.
Figure 4:
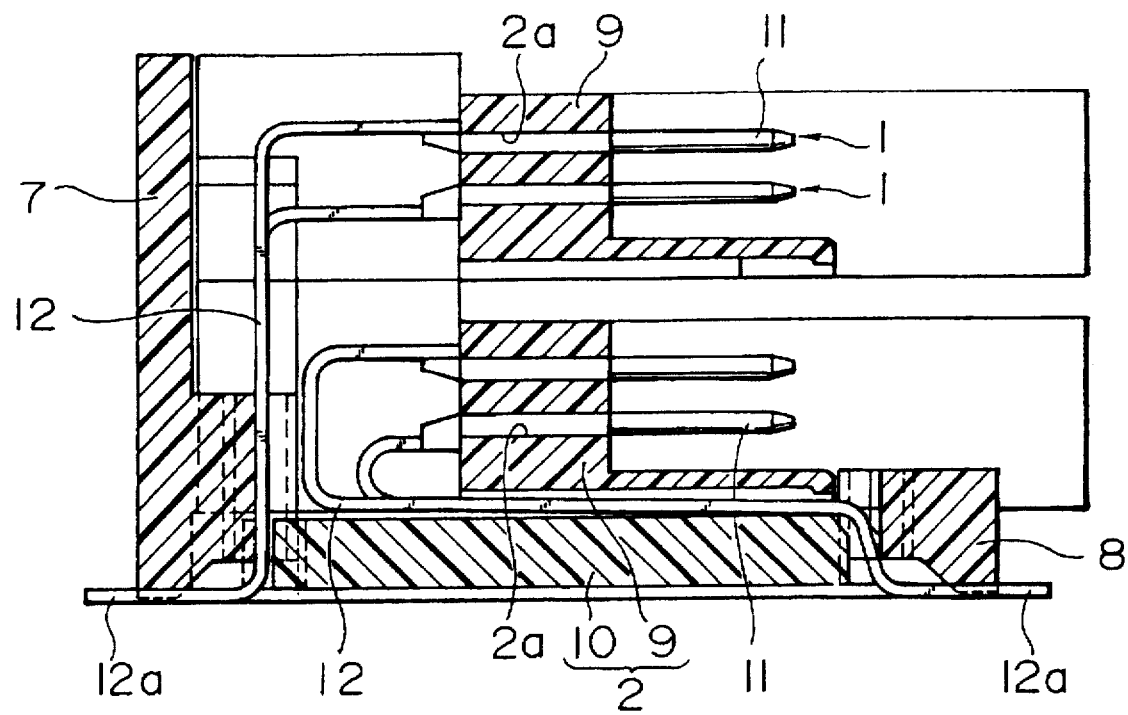
FIG. 4 is a cross sectional view of the header section of the aforementioned connector.

FIG. 1 is a plan view of the entire surface mounting type PC card connector of an embodiment of the present invention; FIG. 2 is a side view of the entire connector; FIG. 3 is a front view of the entire connector; and FIG. 4 is a cross sectional view of the header section of the connector. Referring to these figures, the connector primarily comprises a header section 3 having a number of pin contacts 1 secured in a pin housing 2 in a predetermined arrangement by press-fitting, two frames 4 with a substantially inverted C-shaped form in which PC cards (not shown), being inserted into or removed from the connector, are guided, an eject mechanism fixed to each frame 4, the mechanism being composed of an eject lever 5 and a push rod 6.

Figure 5:
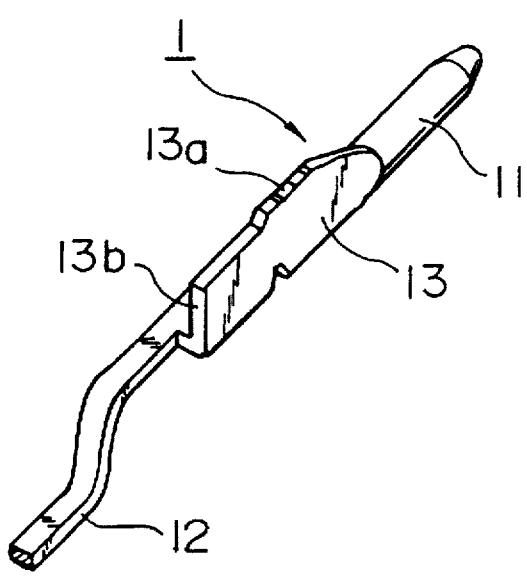
FIG. 5 is a perspective view of the critical portion of a pin contact used in the aforementioned connector.

As illustrated in FIG. 5, the pin contact 1 has a substantially circular cylindrical contact end 11 at one end and a long and narrow terminal end 12 at the other end, and a tab 13 formed from the back end of the contact end 11, the tab 13 being erected perpendicular to the base of the terminal end 12 and being of the same thickness as the terminal end 12. In addition, it has an anchor portion 13, formed by a surface extending substantially perpendicular to the direction of erection of the tab 13, which is anchored by the inner wall of the pin inserting holes 2a of the pin housing 2. Further, it has a jig bearing portion 13b formed by the back face of the tab 13 to which the jig (not shown) is brought into contact in order to press-fit the pin contacts into the pin housing 2. More specifically, the front end portion of the contact end 11 has a tapered form, and the other end of the contact end 11 is cylindrical with a diameter of 0.44 millimeters. The terminal end 12 and the tab 13 have a thickness of 0.3 millimeters, with the terminal end 12 formed into a predetermined shape.

Figure 6:
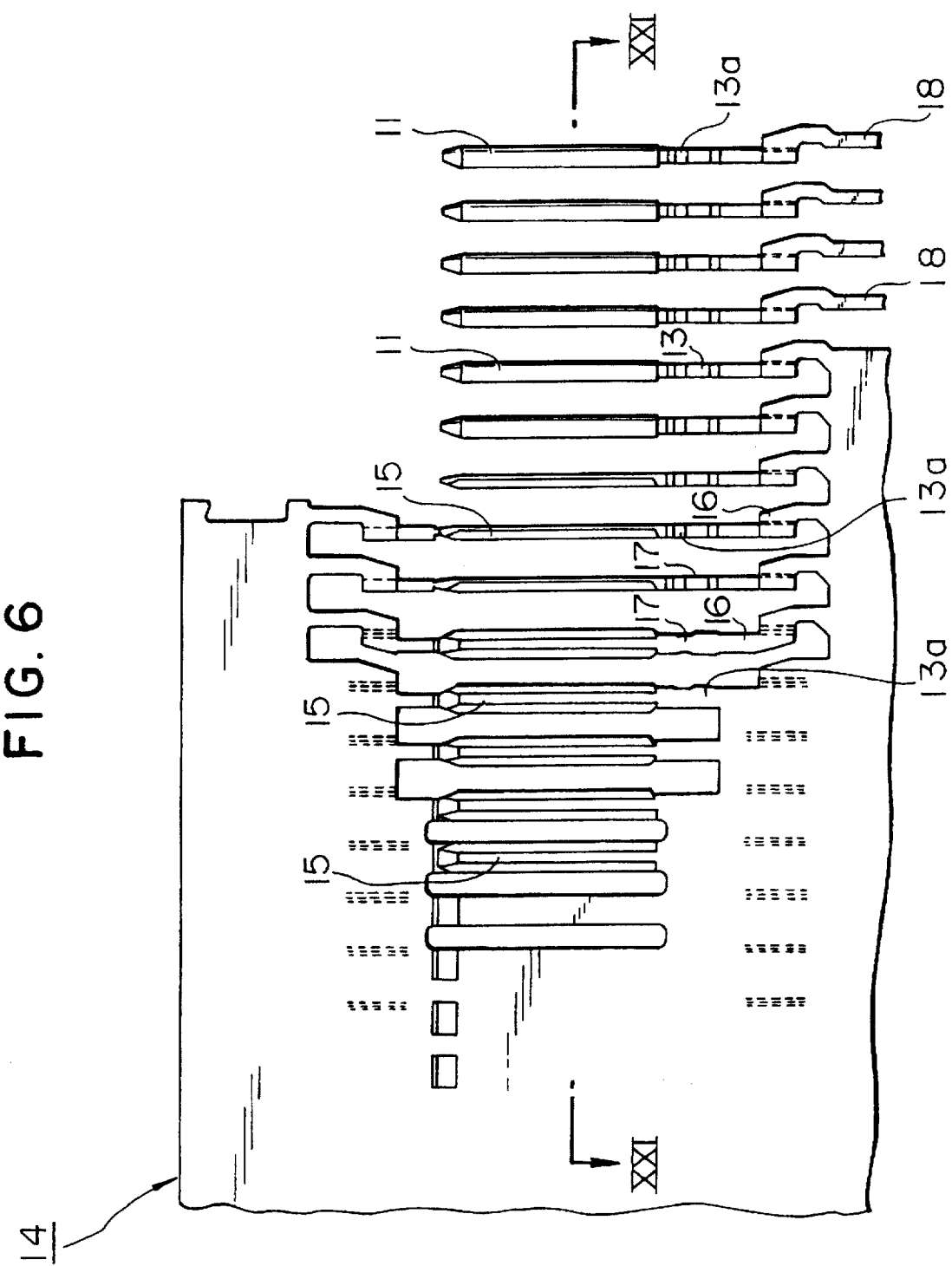
FIG. 6 is an illustration of the manufacturing process of a pin contact, showing the changes in the planar form of the pin contact.

As illustrated in FIG. 6, the pin contact 1 is manufactured by the following processes. The manufacturing processes proceed from left to right in the figure.

In manufacturing the pin contact 1, there is, first, prepared a hoop-shaped metal sheet blank 14 with a thickness of 0.3 millimeters carried by a carrier tape (not shown). The metal sheet blank 14 is punched and pressed to form a long and narrow portion 15 later to become the contact end 11. The pressing is carried out in order to form the front end and the inclined flank surfaces of the long and narrow portion 15. Then, punching is further performed in order to form a linear narrow width portion 17 (including the long and narrow portion 15) which extends out from a substantially L-shaped securing portion 16, after which the securing portion 16 is bent to form a right angle in order to erect the narrow width portion 17 sideways. Before the narrow width portion 17 is erected sideways, however, an anchor portion 13a is formed by the flanks of the narrow width portion 17 at the back of the long and narrow portion 15. Thereafter, the front end of the erected narrow width portion 17 is cut off from the base material and the long and narrow portion 15 is pressed along the direction of erection of the erected narrow width portion 17, thereby forming the substantially circular cylindrical contact end 11, with the front end being tapered and the other portion having a diameter of 0.44 millimeters. Pressing the base material (in the lower part of the figure) supporting the linking member 16 forms a long and narrow portion 18 later to become the terminal end 12, followed by cutting out of a predetermined number thereof from the hoop-shaped metal sheet blank 14, and forming of the long and narrow portions 18 into the terminal ends 12. The pitch between adjacent terminal ends 12 is set at 1.27 millimeters.

The thus-obtained predetermined number of pin contacts 1 carried by the carrier tape are inserted starting from their contact ends 11 into the pin inserting holes 2a of the pin housing 2 and separated from the carrier tape. Then, the amount of protrusion of each terminal end 12 is adjusted by anchoring the anchor portion 13a in the inner wall of the pin insertion hole 2a. Finally, the front end portion of each terminal end is aligned by cutting, thereby completing the securing of the pin contacts 1 in the pin housing.

In the present embodiment, it is possible to form a substantially circular cylindrical contact end 11 from a thin sheet blank with a thickness of 0.3 millimeters by pressing the long and narrow portion 15 of the erected narrow width portion 17 along the direction of erection of the narrow width portion 17. Therefore, it is possible to manufacture a pin contact 1 using the relatively cheap metal sheet blank 14 rather than materials with an ununiform thickness, which are very costly. Before the narrow width portion 17 is erected sideways, the flank of the punched narrow width portion 17 later to become the contact end 11 (or the long and narrow portion 15) is pressed into a smaller area. Therefore, carrying out pressing operations after the sideways erection of the narrow width portion 17 makes it easier to finish the surface of the contact end 11 into a smooth curve, so that the roughness of the flank surfaces do not become a serious problem, thereby making this manufacturing method suitable for manufacturing highly reliable pin contacts 1.

In the thus-manufactured pin contact 1, the tabular portion of the narrow width portion 17 at the back of the contact end 11 becomes the tab 13. The anchor portion 13a, which is anchored in the inner wall of the pin insertion hole 2a of the pin housing 2, is formed by the face perpendicular to the direction of erection of the surface of the tab 13, causing the anchor portion 13a to face a direction substantially perpendicular to the direction of arrangement of the pin contacts 1. Therefore, deformations in the pin housing 2 due to press-fitting of a pin contact therein do not add up, resulting in a more constant alignment pitch between the secured pin contacts 1. In the pin contact 1, the rear end of the tab 13 is formed as the jig bearing portion 13 to which the jig is contacted to press-fit the pin contact 1 into the pin housing 2. Since the jig bearing portion 13b extends perpendicular to the direction of arrangement of the pin contacts 1, which places few dimensional restrictions, the jig bearing portion 13b can be formed into one having a large enough area, even when the pin contacts are arranged at a narrow pitch of 1.27 millimeters, thereby facilitating the press-fitting operation.

A description will now be given of the component parts, besides the pin contact 1, of the header section 3.

The header section 3 primarily comprises a pin housing 2 having a predetermined number of pin contacts 1 press-fitted therein, and two pin holders 7, 8, provided at the front and at the back of the pin housing 2. The pin housing 2 comprises two body sections 9, an upper and a lower body section, with the same shape, and a base section 10 located below the body section and directly mounted onto the mounting surface of the printed board. The body sections each have pin contacts 1 press-fitted therein. The pin holder 7 disposed at the back of the pin housing 2 positions the terminal ends 12 of the pin contacts 1 protruding out downwardly from the upper body section 9. The other pin holder 8 disposed forwardly of the pin housing 2 positions the terminal ends 12 of the pin contacts 1 protruding out downward from the lower body section 9 and toward the pin holder 8.

Figure 7:
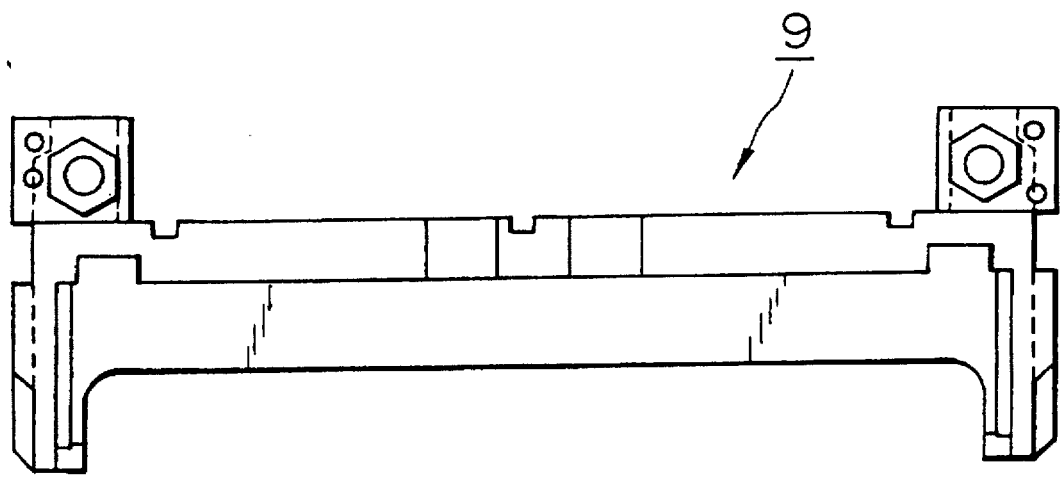
FIG. 7 is a plan view of a body section of the pin housing of the connector.
Figure 8:
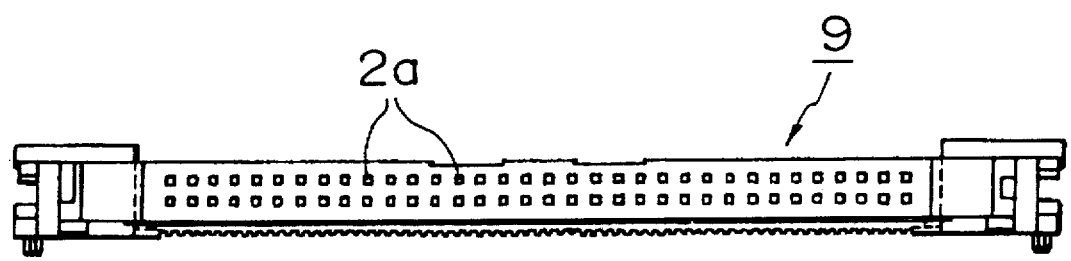
FIG. 8 is a front view of the body section of the pin housing of FIG. 7.
Figure 9:
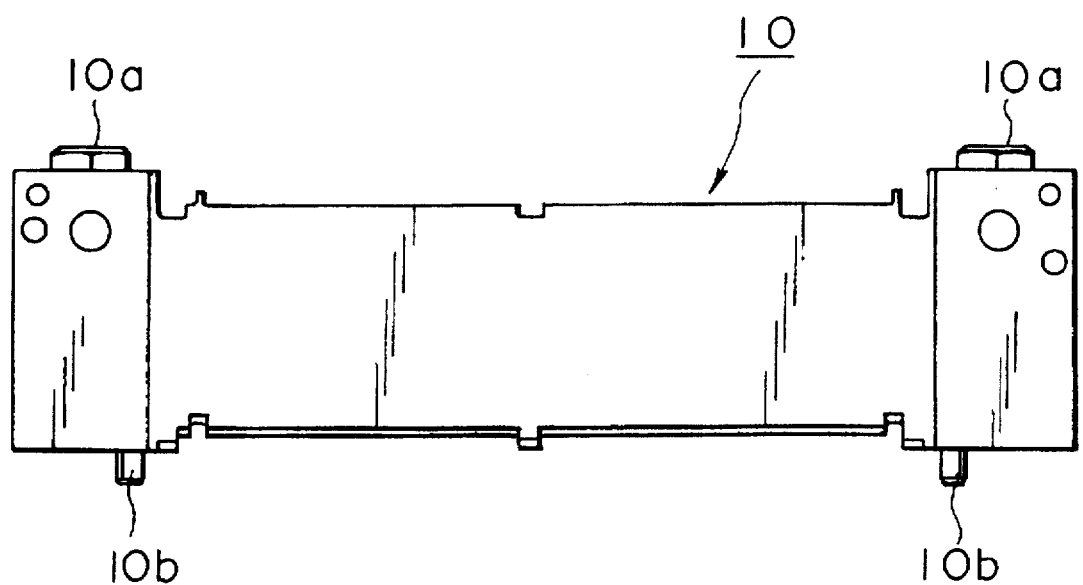
FIG. 9 is a plan view of the base section of the pin housing of the connector.
Figure 10:
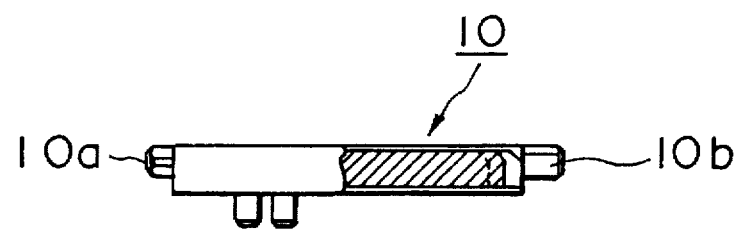
FIG. 10 is a partial cross sectional side view of the base section of FIG. 9.
Figure 11:
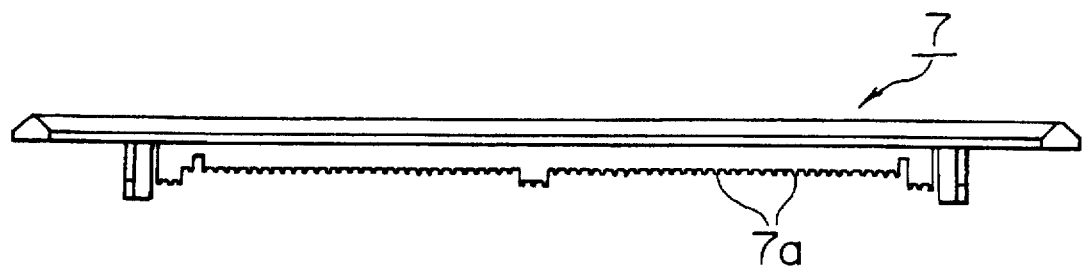
FIG. 11 is a plan view of the pin holder provided behind the pin housing of the connector.
Figure 12:
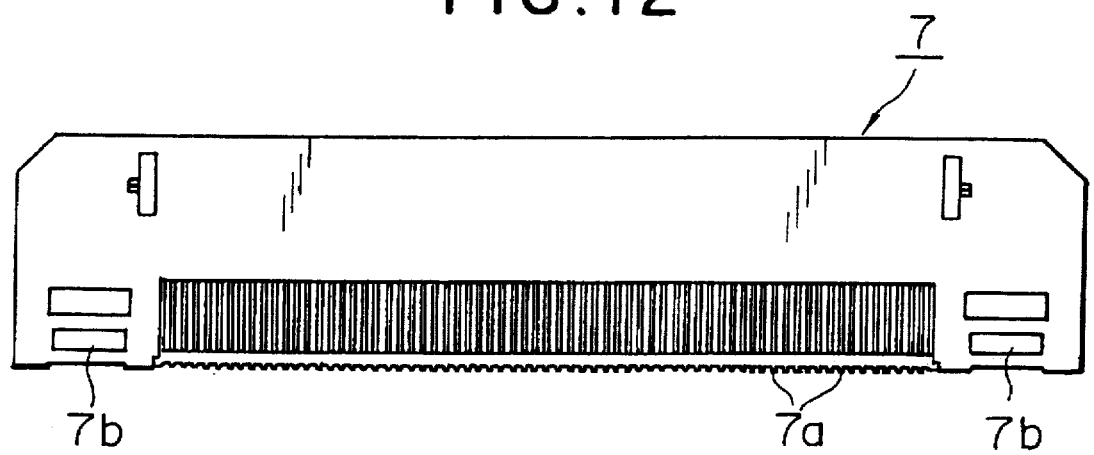
FIG. 12 is a front view of the pin holder of FIG. 11.
Figure 13:
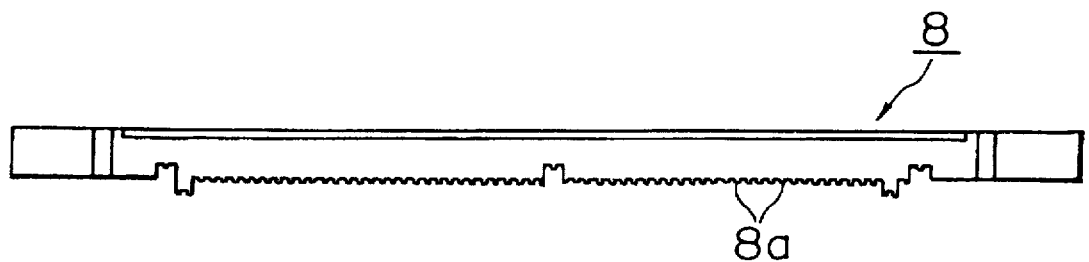
FIG. 13 is a plan view of the pin holder provided in front of the pin housing of the connector.
Figure 14:
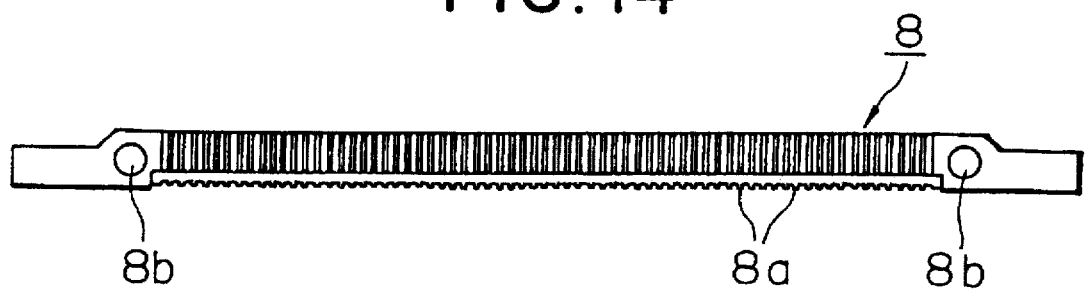
FIG. 14 is a rear view of the pin holder of FIG. 13.
Figure 15:
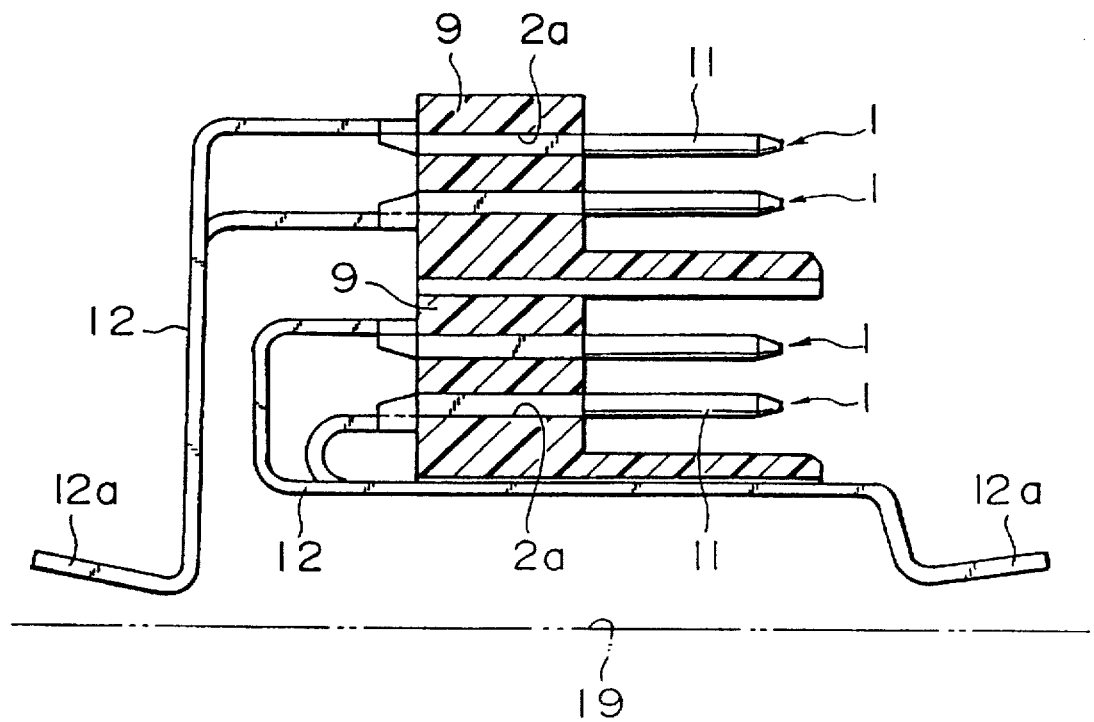
FIG. 15 is illustrative of the form of the terminal ends of the pin contacts after forming in the manufacturing process of the connector.

One body section 9 of the pin housing 2 is a molded part as illustrated in FIGS. 7 and 8, which are a plan view and a front view of the one body section 9, respectively. The base section 10 is a molded part as illustrated in FIGS. 9 and 10, which are a plan view and a partial cross sectional side view of the base section 10, respectively. The pin holder 7 is a molded part illustrated in FIGS. 11 and 12, which are a plan and a front view of the pin holder 7, respectively. The pin holder 8 is a molded part as illustrated in FIGS. 13 and 14, which are a plan view and a rear view of the pin holder 8, respectively. Referring to these figures, there are formed in the front and bottom sides of the pin holder 7 a plurality of parallel guide grooves in which the terminal ends 12 of the plurality of pin contacts 1 protruding out from the upper body section 9 can be positioned. There are formed at the back and bottom sides of the pin holder 8 a plurality of parallel guide grooves 8a in which the terminals 12 of the plurality of pin contacts 1 protruding out from the lower body section 9 are positioned. The pin holder 7 is secured to the base section 10 by inserting a protrusion 10a of the base section 10 into an insertion hole 7b, and the pin holder 8 is secured to the base section 10 by inserting a protrusion 10b of the base section 10 into an insertion hole 8b. Prior to the securing of the pin holders 7, 8 to the base section 12, the front end portion 12a (or the soldering portion) of the terminal end 12 of the pin contact 1, facing upward with respect to the printed board 19, may be formed, as shown in FIG. 15. If this is done and the pin holders 7, 8 having guide grooves in which the terminal ends 12 are positioned are secured to the base section 10, the front end portion 12a of each terminal end 12 is brought into resilient contact with the bottom surface of the pin holder 7 or 8, preserving the required degree of flatness of the front ends. Therefore, when the pin housing 2 is mounted onto the printed board 19 and the bottom surfaces of the pin holders 7, 8 are disposed such that they oppose the mounting surface at a close distance, the front end portions 12a of the terminal ends 12 can be placed on the printed board 19, without any displacement, at the predetermined positions.

As can be understood from foregoing description, the terminal ends 12 of the plurality of pin contacts 1 are each positioned in either of the guide grooves 7a, 8a, and the pin holders 7, 8, whose bottom surfaces are in resilient contact with the front end portions 12a of the terminal ends 12, are secured to the pin housing 2, so that not only is the required degree of parallelism of the terminal ends 12 preserved, but also the required degree of flatness of the front end portions 12a to be soldered onto the printed board 19 is preserved. Therefore, mounting the pin housing 2 onto the printed board 19 and making the bottom surfaces of the pin holders 7, 8 oppose the mounting surface at a close distance constantly prevents displacement or slanting of the front end portions 12a of the terminal ends 12 and thus makes possible simple and reliable soldering of the terminal ends 12 onto the printed board 19 at predetermined positions.

A description will now be given of the frames 4 and the eject mechanism (composed of the eject lever 5 and the push rod 6) of the surface mounting type PC card connector of the present embodiment.

Figure 16:
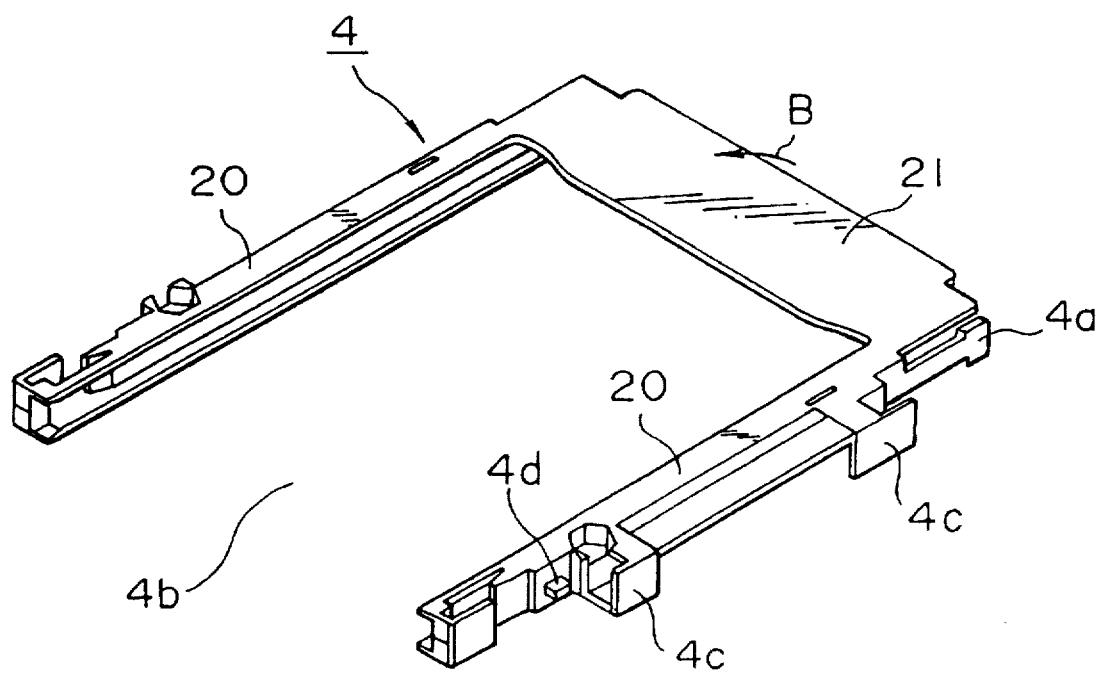
FIG. 16 is a perspective view of a frame of the connector.

In the connector, two substantially C-shaped frames 4 (refer to FIG. 16) are placed above and below each other and secured together. The upper frame 4 is fitted to the side wall of the upper body section 9 of the pin housing 2, and the lower frame 4 is fitted to the side wall of the lower body section 9 of the pin housing 2. The upper frame is fitted by retaining a substantially T-shaped retainer 4a protruding out from the right and left sides of the frame's back side by the side wall of the upper body section 9. The lower frame is fitted by retaining retainer 4a by the side wall of the lower body section 9 of the pin housing 2. Each frame 4 comprises a pair of recess grooves 20 and a bridge section 21. The recess grooves 20, extending from front to back in the figure, are used to guide the PC card, being inserted or removed, along the grooves on both sides of the card from the widthwise direction. In addition, the front ends define the guide insertion opening 4b. The bridge section 21 connects the back ends of the recess grooves 20. When the retainer 4a is retained by the side wall of the body section 9, the pin contact 1 press-fitted to the body section 9 faces the inside of the guide insertion opening 4b. In each of the frames 4, the bridge section 21 can be made flexible to allow it to bend with respect to the pair of recess grooves 20 in the direction of arrow B in FIG. 16 by forming the portion where the bridge section 21 and the recess grooves 20 merge with each other into a relatively narrow width. Two circular bosses 21a, 21b protrude out from the intermediate portion of the bridge sections 21 of the frames 4, the two bosses 21a, 21b being inserted into two shaft holes 5a, 5b formed in the intermediate portion of the eject lever 5. Of the two circular bosses, the circular boss 21a functions as a rotating shaft allowing the eject lever 5 to be rotatably supported by the frames 4. A rod supporting frame 4c protrudes out from one of the recess grooves 20 of each frame 4 for supporting the push rod 6 such that it can freely move forward and backward. One end of the eject lever 5 engages the two-leg section 6a at the rear end of the push rod 6, and the contact member 5c at the other end of the eject lever 5 is capable of slight forward and backward movement at the corner in the header section 3 upon rotation of the lever 5. The eject lever 5 is made of metal, and the push rod is a molded part.

More specifically, in this connector, as the PC card, inserted into either one of the upper or lower card insertion opening 4b, advances along frame 4 to within the header section 3, the card contact member 5c of the eject lever 5 is pushed into the PC card causing it to withdraw. When this happens, the push rod 6 moves toward the front, immediately after which the socket contact in the PC card is connected to the pin contact 1, thereby completing the insertion of the card. In removing the PC card in an inserted state, pushing in the corresponding push rod 6 causes the eject lever 5 to rotate in a counterclockwise direction in FIG. 1 and thus the card contact member 5c to advance forward. Therefore, the PC card is pushed into the contact member 5c and is separated from the pin contact 1, so that the card can be easily removed from the card insertion opening 4b with the fingers.

Figure 17:
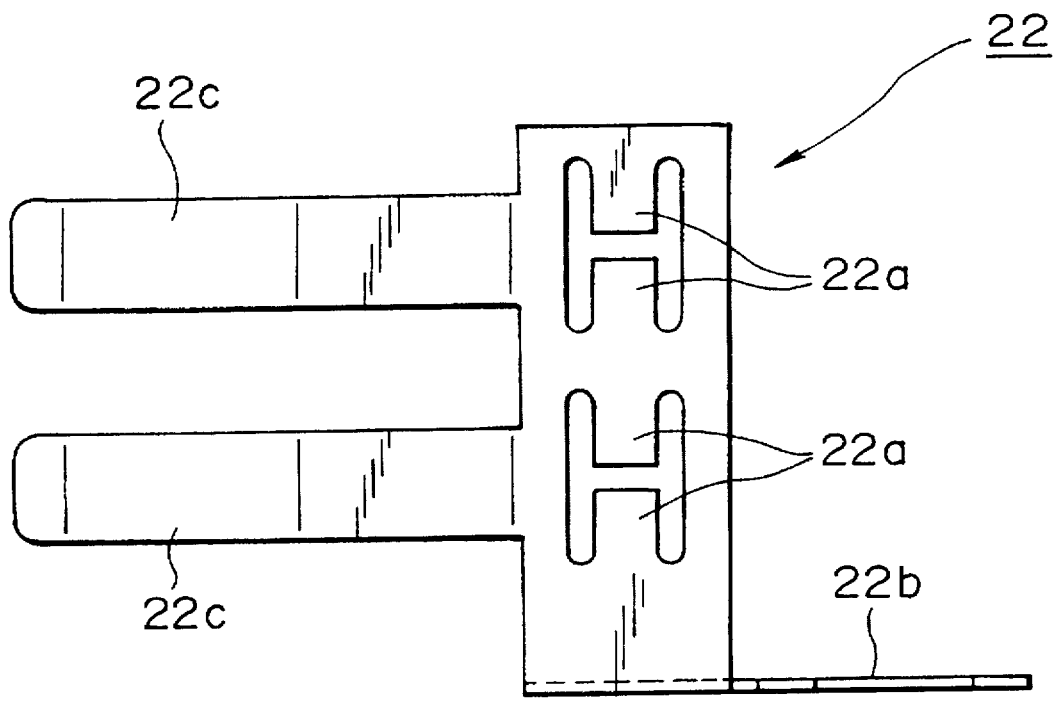
FIG. 17 is a side view of a ground metal fitting before it fastens the frames.
Figure 18:
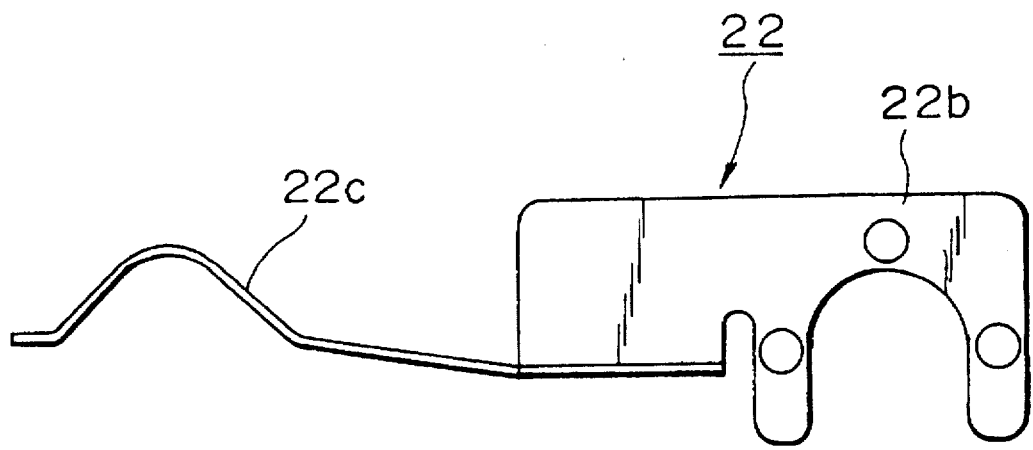
FIG. 18 is a plan view of the ground metal fitting before it fastens the frames.
Figure 19:
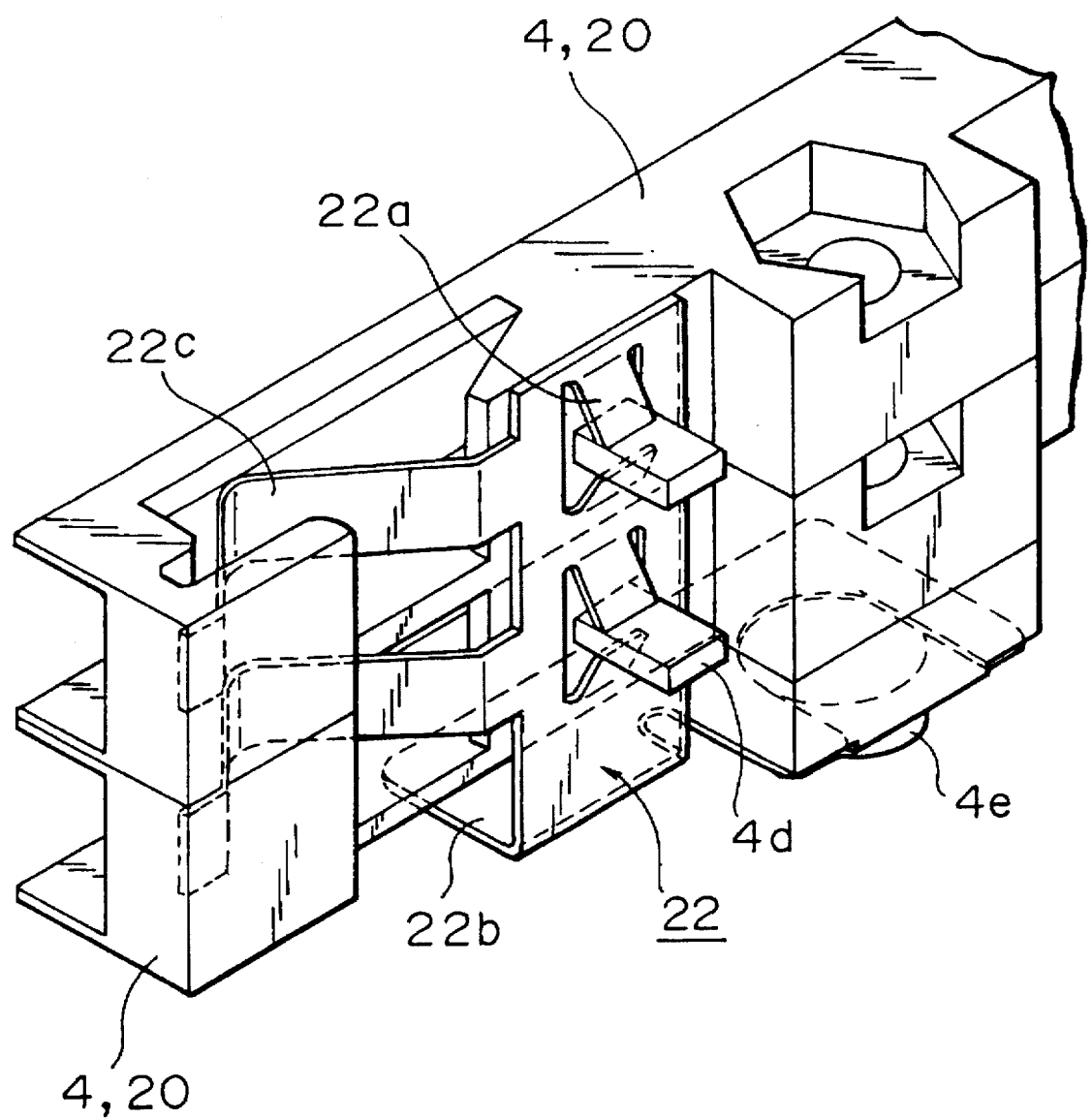
FIG. 19 is illustrative of the critical portion of the ground metal fitting fastening the frames.

As can be understood from the foregoing description, the surface mounting type PC card connector of the present embodiment comprises body sections 9, placed above and below each other, having fixed therein pin contacts 1 in a predetermined arrangement, frames 4 including a card insertion opening 4b at the front end and having the rear end fitted to the body section 9, and an eject lever 5 and a push rod 6 both of which are supported by the frame 4. Accordingly, it is a connector in which a PC card can be inserted either in the upper or the lower frame, thereby allowing it to handle two PC cards. Here, the upper and the lower frames 4 are secured together at a total of four locations, two locations at the front and two locations at the back. The front left and right sides of the frames are secured to each other by ground metal fittings, which are ground terminals. Before the metal fittings are used to secure the frames 4, they have the form illustrated in the side and plan views of the metal fitting of FIGS. 17 and 18, respectively. As illustrated in FIG. 19, the upper and lower frames 4 can easily be secured together by ground metal fittings 22, when rectangular bosses 4d projecting out from the recess grooves 20 of the frames 4 are press-fitted between the tongue sections 22a, being bent, and the bottom tabular portion 22b is engaged with boss 4e protruding out from the bottom portion of the frame 4 for performing positioning with respect to the printed board 19. When the ground metal fittings 22 secure the frames 4 together in this way, a pair of bent resilient portions 22c extending toward the front end of the ground metal fitting are positioned such that they are in resilient contact with the surfaces of the PC cards being inserted into the upper and lower frames 4, and the bottom tabular portion 22 is positioned such that it press-contacts the ground circuit (not shown) of the printed board 19 at the stage of mounting.

Accordingly, when the connector is constructed as having two one PC card handling frames 4 that are disposed above and below each other into two layers so that the connector can handle two PC cards, and when a portion of the ground metal fittings 22 that secure the two frames 4 at a plurality of locations each function as a ground terminal, it will no longer be necessary to form a new frame intended to handle two PC cards, and to incorporate separate ground terminals for each frame 4, thereby making it possible to reduce costs significantly. In addition, the ground metal fitting 22 makes it possible to use fewer fastening parts, thereby minimizing the number of parts and assembly manhour required. Further, the frames 4 can be easily fastened together from the outer side, thus facilitating assembly.

Figure 20:
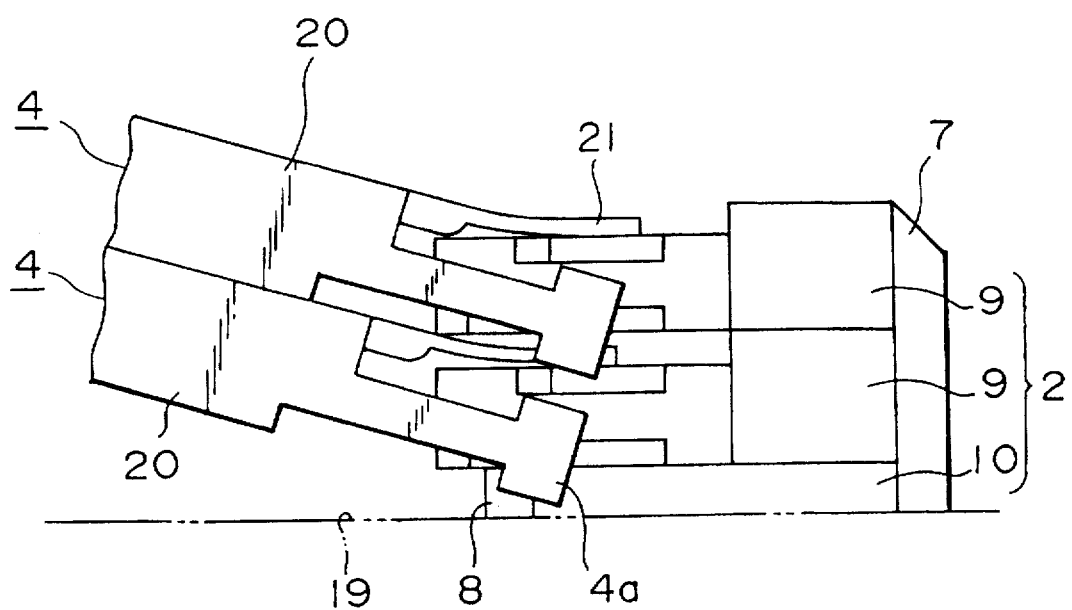
FIG. 20 is illustrative of the frame being secured to the back of the header section of the connector.
Figure 21:
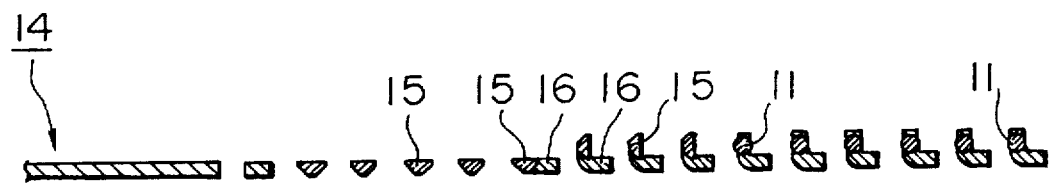
FIG. 21 is a cross sectional view of the changes in the cross sectional form of the pin contact in the manufacturing process illustration of FIG. 6.

In the connector, the pin housing 2 and the frames 4 are separate component parts, so that the frames 4 can be retained by the pin housing 2 after automatic mounting of the header section 3 onto the printed board 19. As in the foregoing description of the present embodiment, the bridge sections 21 of the frames 4 can be made flexible such that they can bend with respect to the pair of recess grooves 20. Therefore, in fitting the frames 4 to the header section 3 after mounting as illustrated in FIG. 20, the retainers 4a at the back end of the frames 4 can be easily retained by the side walls of the pin housing by pushing in the frames 4 toward the header section 3, while the bridge section 21 is being bent, from obliquely above the mounting surface of the printed board 19. Therefore, even when other component parts are previously mounted below the frame 4, an integral construction of the frames 4 and the previously-mounted header section 3 can be realized, without the possibility of frame breaking, thereby assuring high-density mounting. In addition, since the frames 4 are fitted to the already-mounted head section 3, relatively low cost resins such as PBT may be used for the frames 4, instead of materials that have high thermal resistance.

The two PC card handling connector described above has twice the number of pin contacts 1 than the one PC card handling connector, and has terminal ends 12 extending not only behind the pin housing 2 but also forwardly of the pin housing 2. Therefore, although in the embodiment the pin holders 7, 8 are mounted in back of and in front of the pin housing 2 respectively, it is only necessary to use one pin holder for the one PC card handling connector.

Although in the foregoing description, the body sections 9 and the base section 10 of the pin housing 2 are separated component parts and are formed into an integral structure later on, the pin holder may be mounted to a pin housing that is an integrally molded structure. In the case where the base section and the body sections of the pin housing are separate component parts and there is a difference in the mounting height of the body section with respect to the mounting surface of the printed board, it is only necessary to make changes in the height of the base section allowing easy molding into a simple form and the forming of the terminal end of each pin contact, thereby making it unnecessary to carry out the complicated operation of changing the form of the body section.

As can be understood from the foregoing description, according to the PC card connector of the present invention, securing the pin holders with guide grooves to the pin housing allows the required degree of parallelism of the terminal ends of the plurality of pin contacts to be preserved. Letting the front end portion (soldering portions) of each terminal end to be in resilient contact with the bottom surface of either one of the pin holders allows the required degree of flatness of the front ends to be preserved. Therefore, placing the bottom surfaces of the pin holders opposite the mounting surface of the printed board at a very close distance is highly effective in constantly preventing positional displacement and slanting of the front end portions of the terminal ends and hence realizing simple and reliable soldering of the terminal ends onto the printed board at predetermined positions.

What is claimed is:

1. A PC card connector wherein a plurality of pin contacts are secured in a pin housing in a predetermined arrangement such that each of the plurality of pin contacts has a long and narrow terminal end protruding out from said pin housing, and a front end portion of said terminal end is soldered onto a mounting surface of a printed board, said PC card connector comprising:

first and second pin holders secured to said pin housing such that bottom surfaces of said first and second pin holders are positioned opposite the mounting surface of said printed board at a close distance, each of said first and second pin holders having a number of parallel guide grooves for receiving the terminal ends of said plurality of pin contacts, wherein the bottom surfaces of said first and second pin holders are in resilient contact with the front end portions of said terminal ends, and wherein said first and second pin holders are secured to said pin housing such that they are disposed, respectively, at the front and at the back of said pin housing, respectively, along the direction of insertion and removal of a PC card.

2. A PC card connector according to claim 1, wherein said pin housing is dividable into body sections and a base section, said body sections having secured therein said pin contacts, and said base section being mounted onto said printed board, and wherein said first and second pin holders are secured to said base section.

3. A PC card connector according to claim 1, wherein said parallel guide grooves of said first and second pin holders are formed therein at the front and bottom sides and at the back and bottom sides, respectively, and wherein said first and second pin holders have formed therein insertion holes into which the protrusions of said pin housing are inserted in order to secure said pin housing to said first and second pin holders.

4. A PC card connector according to claim 1, wherein, before securing the first and second pin holders to the pin housing, the front end portions of said terminal ends of said pin contacts face upward with respect to said printed board, and wherein, after securing said first and second pin holders to said pin housing, the front end portion of each of said terminal ends contacts the bottom surface of one of said first and second pin holders such that the front end portions of said terminal ends are resiliently biased into required positions.

* * * * *